(12) United States Patent
Sze et al.

(10) Patent No.: US 8,910,775 B2
(45) Date of Patent: Dec. 16, 2014

(54) TRANSFER APPARATUS FOR TRANSFERRING ELECTRONIC DEVICES

(75) Inventors: Chak Tong Sze, Hong Kong (HK); Pei Wei Tsai, Hong Kong (HK); Wing Sze Chan, Hong Kong (HK); Cho Hin Cheuk, Hong Kong (HK); Tsz Chun Chow, Hong Kong (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 238 days.

(21) Appl. No.: 13/571,419

(22) Filed: Aug. 10, 2012

(65) Prior Publication Data

US 2014/0041996 A1    Feb. 13, 2014

(51) Int. Cl.
*B65G 47/80*    (2006.01)
(52) U.S. Cl.
USPC ............... 198/725; 198/464.2; 198/483.1; 198/471.1; 198/380

(58) Field of Classification Search
None
See application file for complete search history.

(56) References Cited

U.S. PATENT DOCUMENTS 5,842,579 A * 12/1998 Garcia et al. ............... 209/573

* cited by examiner

*Primary Examiner* — Kavel Singh
(74) *Attorney, Agent, or Firm* — Ostrolenk Faber LLP

(57) ABSTRACT

A transfer apparatus has a conveying track for electronic devices in a row, two vacuum passages to create vacuum forces to hold electronic devices against the conveying track at first and second positions respectively preventing overlapping of electronic devices; and sensors arranged with respect to the conveying track, the first sensor detects presence or absence of the leading electronic device at the first position for removal of the leading electronic device from the conveying track, and the second sensor detects presence or absence of the leading electronic device at a sensor position between the first and second positions as the leading electronic device is conveyed along the conveying track from the second to the first vacuum passage.

13 Claims, 6 Drawing Sheets

TRANSFER APPARATUS FOR TRANSFERRING ELECTRONIC DEVICES

FIELD OF THE INVENTION

This invention relates to a transfer apparatus, particularly but not exclusively, for transferring electronic devices to a testing apparatus for testing operational characteristics of the electronic devices.

BACKGROUND OF THE INVENTION

A test handler is used in the semiconductor industry for testing operational characteristics of electronic devices, such as light-emitting diodes (LEDs) or other integrated circuit (IC) packages. For instance, the test handler may test and classify LEDs into different grades according to their emitted light intensity, colour, etc. Specifically, the test handler comprises a testing apparatus for testing characteristics of electronic devices, an input module (e.g. a vibratory feeder) for transferring the electronic devices towards the testing apparatus, and a suction pickup device for transferring the electronic devices successively from the input module to the testing apparatus. The feeder typically includes a linear track along which the electronic devices are conveyed and lined up as the feeder vibrates. The feeder also includes a cover arranged over the linear track for retaining the electronic devices within the feeder during operation. In particular, the cover includes an opening through which the electronic devices are successively picked up by the suction pickup device from the feeder to the testing apparatus.

One problem encountered by conventional test handlers relates to adjacent electronic devices overlapping onto each other. FIG. 1a illustrates side and top views of a conventional electronic package 100, which comprises a main body 102 and electrical leads 104 extending from the main body 102. FIG. 1b illustrates the conventional electronic packages 100 being conveyed along a linear track 106 of a vibratory feeder. As the electronic packages 100 are being conveyed along the linear track 106 of the vibratory feeder, the electrical leads 104 of adjacent electronic packages 100 may mount onto each other. Such a phenomenon is known as "piggybacking". FIG. 1b also shows the feeder comprising a cover 108 that is arranged over the linear track 106, wherein a suction pickup device 110 of the test handler would not be able to pick up the electronic package 100 due to such piggybacking. Thus, it is necessary to separate the first two leading electronic packages 100 before the suction pickup device 110 picks up respective electronic packages 100 from the feeder to the testing apparatus.

A conventional input module for transferring electronic packages is shown in FIG. 2, which comprises a vibratory feeder 200 having a linear track 201 with first and second vacuum passages 202a, 202b and a track end sensor 204 (hidden from view by the leading electronic package) arranged at the end of the linear track 201. As the feeder 200 vibrates, the electronic packages are lined up and conveyed along the linear track 201. Upon the leading electronic package being detected by the track end sensor 204, the first vacuum passage 202a is activated to create a vacuum force beneath the leading electronic package. This holds the leading electronic package in place on the linear track 201 as it awaits pickup by a suction pickup device 206. At the same time, the second vacuum passage 202b is also activated to create a vacuum force beneath its adjacent electronic package to hold it in place on the linear track 201. As the suction pickup device 206 moves downward to pick up the leading electronic package from the feeder 200, the first vacuum passage 202a is deactivated to remove the vacuum force beneath the leading electronic package 100 so that a suction force from the suction device 206 holds the leading electronic package and transfers it from the feeder 200 to a testing apparatus for testing.

However, a drawback of the conventional input module of FIG. 2 is that there is no mechanism that creates a gap between the leading and adjacent electronic package to prevent piggybacking. Moreover, the time lag in the removal of the vacuum forces created by the first and second vacuum passages 202a, 202b. In particular, if a residual vacuum force from the first vacuum passage 202a remains after the first vacuum passage 202a is deactivated, the suction force from the suction device 206 may not be strong enough to overcome the residual vacuum force to effectively transfer the leading electronic package from the feeder 200 to the testing apparatus unless a sufficiently long pick delay time is used to ensure the residual vacuum force has dissipated.

Thus, it is an object of the present invention to seek to propose a transfer apparatus for transferring electronic packages that addresses the drawbacks of the conventional apparatus, and to provide the public with a useful choice.

SUMMARY OF THE INVENTION

A first aspect of the invention is a transfer apparatus for transferring electronic devices. The transfer apparatus comprises: i) a conveying track for conveying electronic devices in a row having a leading electronic device located at a front of the row; ii) first and second vacuum passages connected to the conveying track, the first and second vacuum passages being operative to create vacuum forces to hold electronic devices against the conveying track at a first device position and a second device position respectively such that there is no overlapping between the electronic devices; and iii) first and second sensors arranged with respect to the conveying track. The first sensor is operative to detect a presence or absence of the leading electronic device at the first device position for removal of the leading electronic device from the conveying track. The second sensor is operative to detect a presence or absence of the leading electronic device at a sensor position between the first and second device positions as the leading electronic device is conveyed along the conveying track from the second vacuum passage to the first vacuum passage.

A second aspect of the invention is a test handler comprising: i) a testing apparatus for testing operational characteristics of electronic devices; ii) the transfer apparatus according to the first aspect of the invention for conveying the electronic devices; and iii) a suction device for transferring the electronic devices from the transfer apparatus to the testing apparatus.

A third aspect of the invention is a method of transferring electronic devices using a transfer apparatus according to the first aspect of the invention. The method comprises the steps of: conveying the electronic devices along the conveying track from the second vacuum passage to the first vacuum passage; detecting the leading electronic device at the sensor position using the second sensor; activating the second vacuum passage to create a vacuum force to hold an electronic device adjacent to the leading electronic device against the conveying track at the second device position based on the detection of the leading electronic device by the second sensor at the sensor position, in order to maintain a separation between the leading electronic device and the adjacent electronic device; detecting the leading electronic device at the first device position using the first sensor; and removing the leading electronic device from the conveying track.

A fourth aspect of the invention is a transfer apparatus for transferring electronic devices, comprising: i) a conveying track for conveying the electronic devices in a row having a electronic device at a front of the row; ii) a vacuum passage connected to the conveying track, the vacuum passage being operative to create a vacuum force to hold an electronic device against to the conveying track; and iii) an ejector arranged within an ejector passage, the ejector being operative to extend from the ejector passage to push the electronic device away from the vacuum passage to assist in the removal of the electronic device from the conveying track at the position of the vacuum passage.

A fifth aspect of the invention is a test handler comprising: i) a testing apparatus for testing operational characteristics of electronic devices; ii) the transfer apparatus according to the fourth aspect of the invention for conveying the electronic devices; and iii) a suction device for transferring the electronic devices from the transfer apparatus to the testing apparatus.

Some preferred but optional features of the various aspects of the invention have been defined in the dependent claims.

BRIEF DESCRIPTION OF THE DRAWINGS

Preferred embodiments of the invention will now be described, by way of example only, with reference to the accompanying drawings, of which:

FIG. 1a are side and top views of a conventional electronic package, while

DETAILED DESCRIPTION OF THE PREFERRED EMBODIMENTS

Figure 1A:
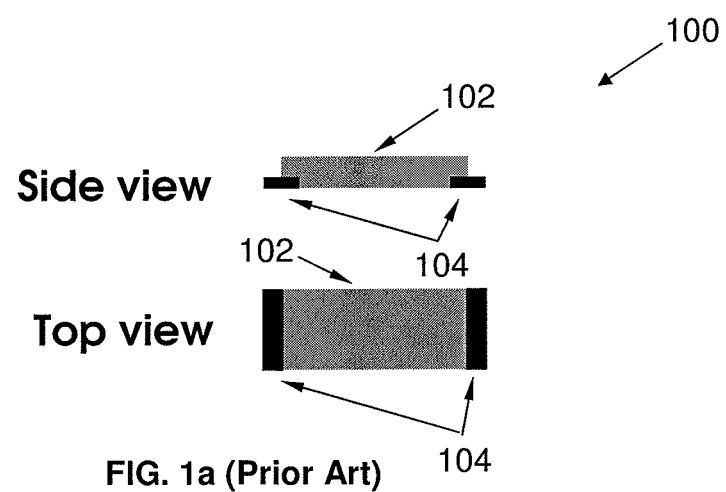
Figure 1B:
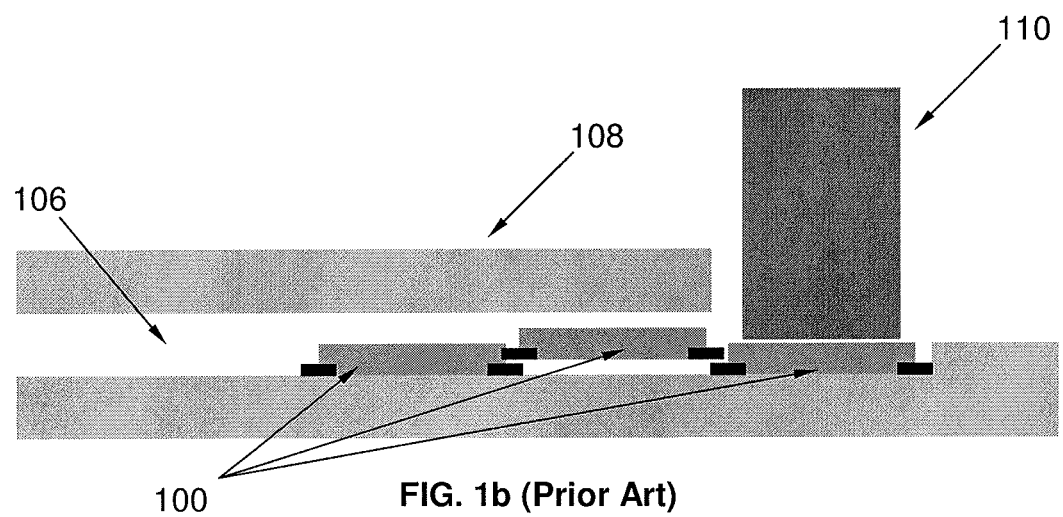
FIG. 1b shows the "piggybacking" of electronic packages as they are being conveyed along a feeder track.
Figure 2:
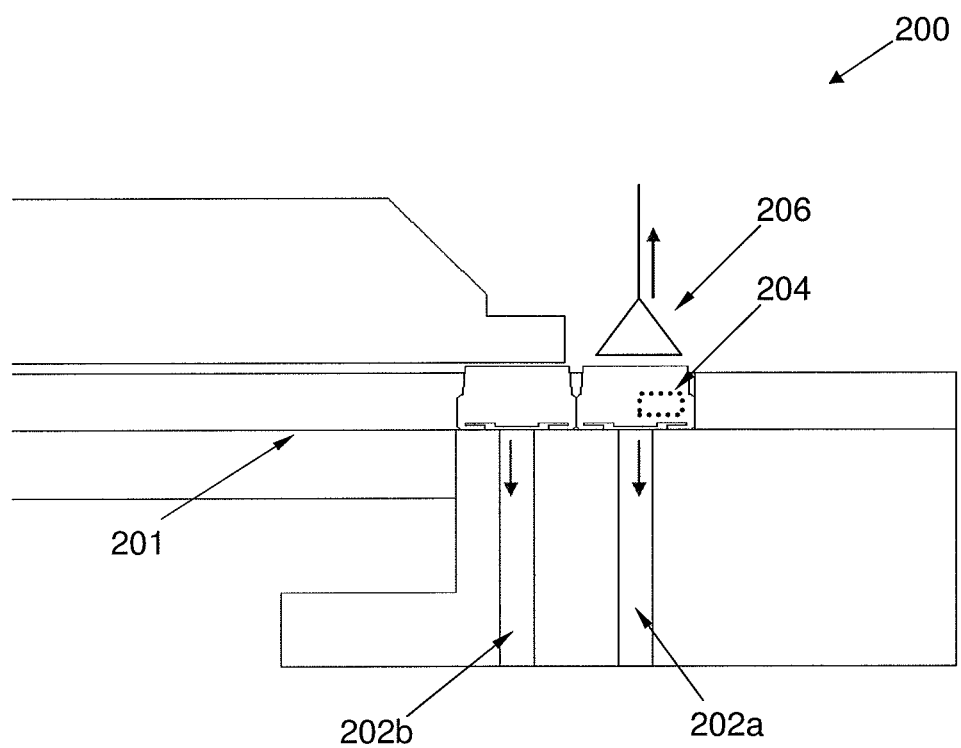
FIG. 2 shows a conventional vibratory feeder.
Figure 3:
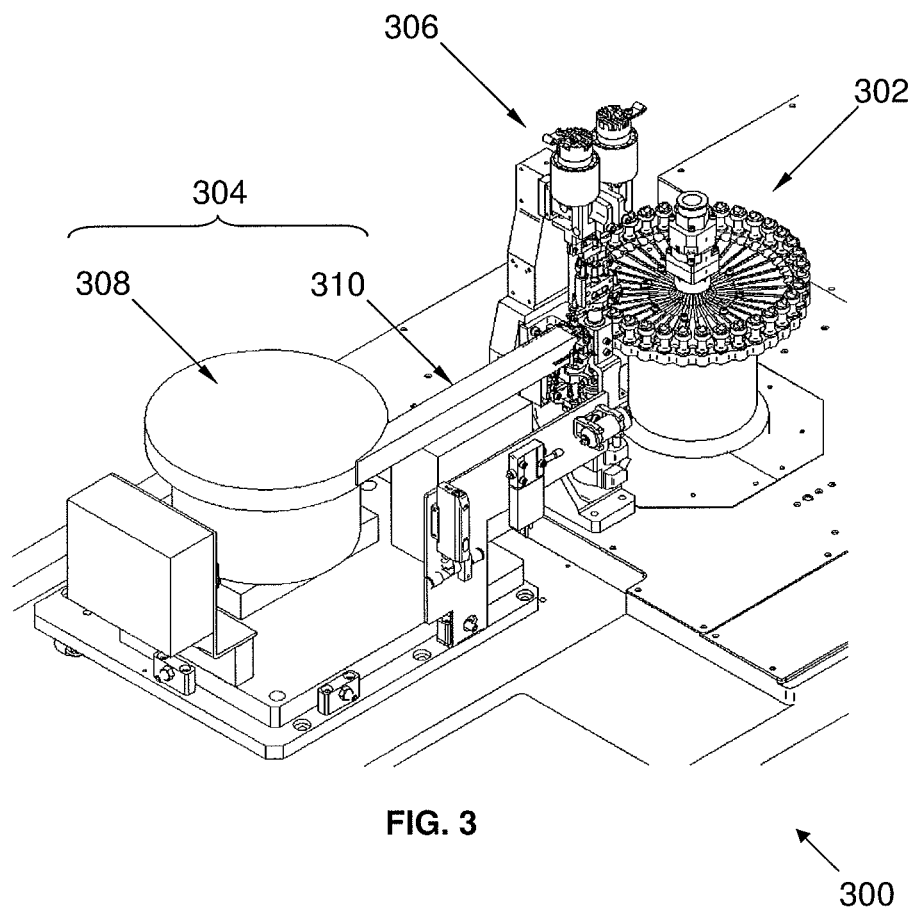
FIG. 3 is an isometric view of a test handler, comprising a transfer apparatus according to a preferred embodiment of the invention.

FIG. 3 is a perspective view of a test handler 300, comprising: i) a testing apparatus (shown as a turret 302) for testing operational characteristics of electronic devices (e.g. electronic packages); ii) an input module (shown as a vibratory feeder 304) for successively transferring the electronic packages towards the turret 302; and iii) a rotary suction device 306 for successively transferring the electronic packages from the feeder 304 to the turret 302. In particular, the vibratory feeder 304 comprises a vibratory bowl 308 having a spiral track (not shown) for conveying the electronic packages in a spiral fashion, and a transfer apparatus 310 connected to the spiral track of the bowl 308 to receive the electronic packages therefrom—in this way, the electronic packages are conveyed along the spiral track of the vibratory bowl 308 and subsequently along a corresponding track of the transfer apparatus 310 as the feeder 304 vibrates.

Figure 4A:
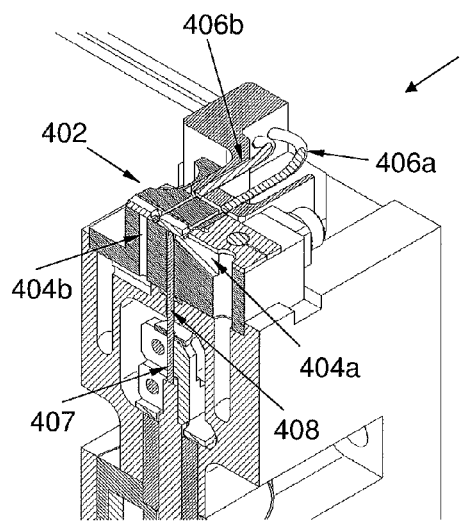
FIG. 4a shows an isometric view of a cross-sectional portion of the transfer apparatus and FIG. 4b shows a plan view of the transfer apparatus according to the preferred embodiment.
Figure 4B:
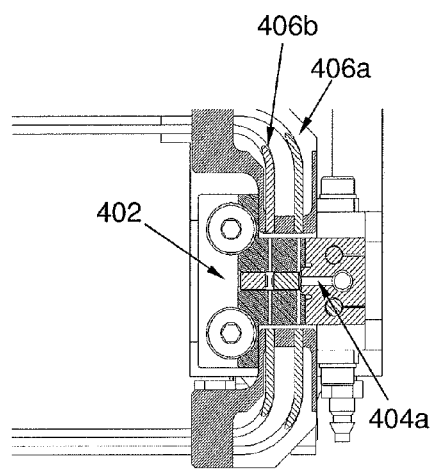

FIG. 4a shows an isometric view of a cross-sectional portion of the transfer apparatus 310 while FIG. 4b shows a plan view of the transfer apparatus 310. Specifically, the transfer apparatus 310 comprises: i) a conveying track 402 for supporting and conveying the electronic packages to the turret 302; ii) first and second vacuum passages 404a, 404b connected to the conveying track 402; iii) a track end sensor 406a and a separation-sensing sensor 406b positioned in relation to the first and second vacuum passages 404a, 404b respectively; and iv) an ejector (shown as an ejecting pin 408) positioned adjacent to the first vacuum passage 404a for assisting in the transfer of the electronic packages to the turret 302. In particular, the track end sensor 406a is located at a fraction of a millimeter (e.g. 0.25 mm) from the extreme end of the conveying track 402. Each of the track end sensor 406a and the separation-sensing sensor 406b may be a digital fiber optic sensor, or any other conventional sensor.

Figure 4C:
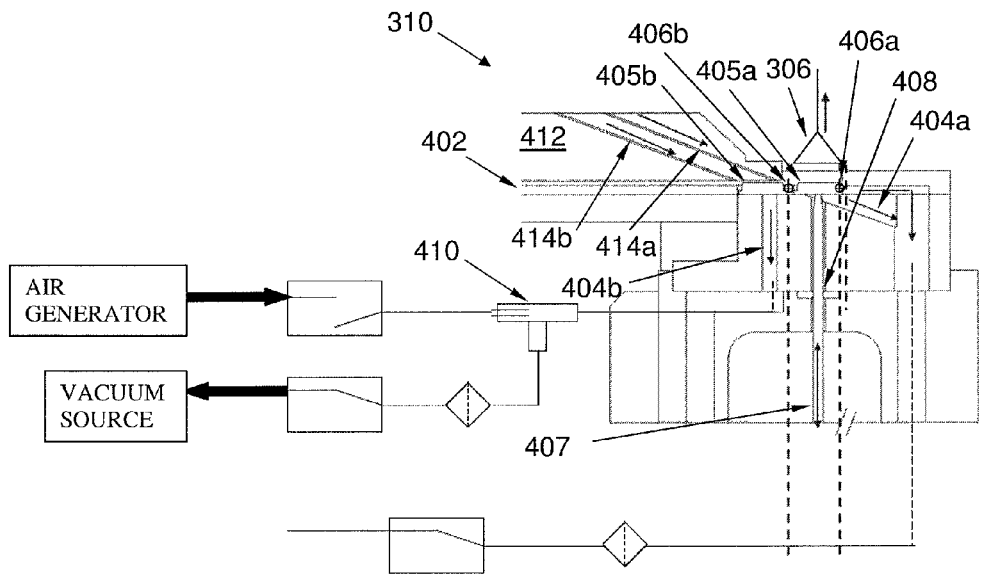
FIG. 4c shows a cross-sectional side view of the transfer apparatus.

Referring to the cross-sectional side view of the transfer apparatus 310 as shown in FIG. 4c, it can be seen that the transfer apparatus 310 further comprises: v) a tee connector 410 connected to the second vacuum passage 404b; and vi) a track cover 412 arranged over the top of the conveying track 402.

The conveying track 402 vibrates to convey and line up the electronic packages for transferring to the turret 302. The first vacuum passage 404a is operative to create a vacuum force beneath a leading electronic package 405a on the conveying track 402 to hold the leading electronic package 405a against the conveying track 402 at a first device position. Similarly, the second vacuum passage 404b is also operative to create a vacuum force beneath an adjacent electronic package 405b on the conveying track 402 to hold the adjacent electronic package 405b against the conveying track 402 at a second device position, as it awaits to be picked up by the rotary suction device 306. Further, a gap is maintained between the leading electronic package 405a and the adjacent leading electronic package 405b such that there is no overlapping between the leading and adjacent electronic packages 405a, 405b. This prevents the adjacent electronic package 405b—and subsequent other electronic packages (not shown)—from contacting the leading electronic package 405a, and to thereby prevent the occurrence of piggybacking.

It should be appreciated that the conveying track 402 may be separate from but connectable to the vibratory bowl 308, such that the conveying track 402 is vibrated by the vibratory bowl 308 when connected thereto. Accordingly, it is unnecessary for the conveying track 402 to include any vibratory mechanism.

Specifically, the track end sensor 406a is operative to detect a presence or absence of the leading electronic device 405a at the first device position for removal of the leading electronic device 405a from the conveying track 402, while the separation-sensing sensor 406b is operative to detect a presence or absence of the leading electronic device 405a at a sensor position between the first and second device positions as the leading electronic device 405a is conveyed along the conveying track 402 from the second vacuum passage 404b to the first vacuum passage 404a.

The ejecting pin 408 is extendable from and retractable along an axial direction of an ejector passage 407 that is adjacent to the first vacuum passage 404a. Accordingly, the leading electronic package 405a may be pushed upward by the ejecting pin 408 towards the suction device 306 to assist in transfer of the leading electronic package 405a to the turret 302. For instance, in the case where the electronic packages are 3528 LED packages of about 1.9 mm in thickness, the leading electronic package 405a may be lifted by the ejecting pin 408 through a distance of about 1.5 mm from the surface of the conveying track 402 towards the suction device 306. Nonetheless, it should be appreciated that the distance through which the ejecting pin 408 protrudes from the surface of the conveying track 402 depends on the thickness (or height) of the electronic packages. For example, the ejecting pin 408 may be configured to protrude from the surface of the conveying track 402 through a distance of between 0.4-2 mm towards the suction device 306.

It should be noted that the ejecting pin 408 may lift the leading electronic package 405a upward, even though the first vacuum passage 404a is still activated and/or the first vacuum passage 404a is deactivated but a residual vacuum force still remains beneath the leading electronic package 405a. Thus, the time lag between deactivation of the first vacuum passage 404b and a complete removal of the vacuum force would not impose a constraint on the operation of the test handler 300—this means that the leading electronic package 405a may be picked up by the suction device 306 immediately after the first vacuum passage 404a is deactivated. In fact, it may even be unnecessary to deactivate the first vacuum passage 404a in order for the suction device 306 to transfer the leading electronic package 405a from the conveying track 402 to the turret 302. Advantageously, the rate of feeding electronic packages from the transfer apparatus 304 to the turret 302 would be higher as compared with those of conventional test handlers.

The track cover 412 comprises first and second air nozzles 414a, 414b operative for directing air towards the electronic packages to speed up the separation between the leading electronic package 405a and the next leading electronic package 405b before pickup by the suction device 306. It should be appreciated that the required separation between adjacent electronic packages before pickup may be any distance that is sufficient to prevent piggybacking. For instance, in the case of 3528 LED packages, a suitable separation between such adjacent packages before pickup may be 0.5 mm. Success or failure of separation between the leading and next leading electronic packages 405a, 405b before pickup by the suction device 306 is detected by the track end sensor 406a and the separation-sensing sensor 406b (as described in more detail below).

Figure 5:
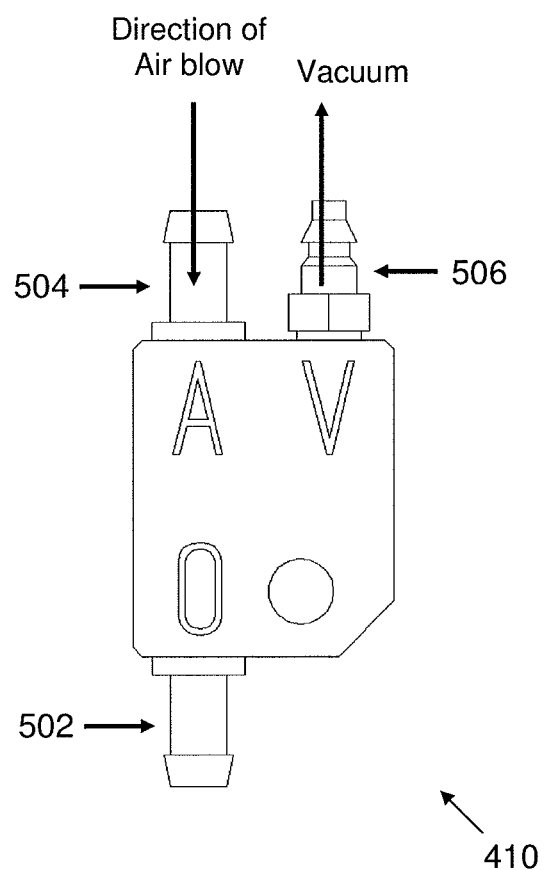
FIG. 5 shows a tee connector of the transfer apparatus according to the preferred embodiment.

The tee connector 410, which connects to the second vacuum passage 404b, is for addressing the transition time between the presence and complete removal of the vacuum force created by the second vacuum passage 404b. FIG. 5 shows an exemplary embodiment of the tee connector 410, which comprises three connecting limbs: i) a passage connecting limb 502; ii) an air-source connecting limb 504; and iii) a vacuum-source connecting limb 506. Specifically, the passage connecting limb 502 connects to the second vacuum passage 404b, while the air-source connecting limb 504 and the vacuum-source connecting limb 506 connect to an air generator and a vacuum source respectively. By blowing an appropriate volume of air from the air generator into the air-source connecting limb 504 and onward to the second vacuum passage 404b, the tee connector 410 is capable of breaking the vacuum force created by the second vacuum passage 404b. In fact, the air from the air generator may be capable of breaking the vacuum force generated by the second vacuum passage 404b such that the latter may be activated continuously during operation of the test handler 300.

Advantageously, there would be a faster response time for the adjacent electronic package 405b to break free from the vacuum force generated by the second vacuum passage 404b, such that the adjacent electronic package 405b moves faster towards the end of the conveying track 402 for pickup and transfer by the suction device 306 to the testing apparatus 302.

An operation of the transfer apparatus 304 will now be described with reference to FIG. 6, which comprises cross-sectional views of eight operational steps of the transfer apparatus 304 and timing charts showing the operational relationship of the test handler parts through each operational cycle of the transfer apparatus 304.

The first air nozzle 414a is activated throughout the operation of the test handler 300. Similarly, the first and second vacuum passages 404a, 404b are also predominantly activated. However, during the first operational step of the test handler 300, the second vacuum passage 404b is deactivated as the second air nozzle 414b is activated in order to push a leading electronic package 605a towards the first vacuum passage 404b at the end of the conveying track 402. At the same time, the suction device 306 begins its descent towards the conveying track 402 of the transfer apparatus 304 for picking up the leading electronic package 605a.

During the second operational step of the test handler 300, the separation-sensing sensor 406b detects a presence of the leading electronic package 605a at the sensor position, and the second air nozzle 414b is accordingly deactivated to slow down the motion of the adjacent electronic package 605b towards the end of the conveying track 402. It should be noted that the first air nozzle 414a continues blowing so that the leading electronic package 605a is accelerated to the end of the conveying track 402 when the direction of air blow is aligned with the rear of the leading electronic package 605a. By continuing to activate the first air nozzle 414a but deactivating the second air nozzle 414b, the leading electronic package 605a is more rapidly conveyed towards the end of the conveying track 402 than the adjacent electronic package 605b, so as to create a separation therebetween.

During the third operational step of the test handler 300, the electronic packages continue moving along the conveying track 402 as the transfer apparatus 304 vibrates while the suction device 306 continues its descent towards the conveying track 402 until it reaches its maximum descent at the fourth operational step.

During the fourth operational step of the test handler 300, the leading electronic package 605a is conveyed across the separation-sensing sensor 406b and this is detected through the separation-sensing sensor 406b detecting an absence of an electronic package at the sensor position. (Since the leading electronic package 605a has not yet been conveyed to the first device position of the conveying track 402, the track end sensor 406a also detects an absence of an electronic package at the first device position.) The second vacuum passage 404b is accordingly activated to hold the next leading electronic package 605b in place on the conveying track 402 at the second device position, to maintain a separation between the leading and next leading electronic packages 605a, 605b. Since the suction device 306 has reached the end of its descent, it is ready to pick up the leading electronic device 605a.

During the fifth operational step of the test handler 300, the leading electronic package 605a reaches the end of the conveying track 402 and this is detected through the track end sensor 406a detecting the presence of an electronic device at the first device position. Such a pattern of electronic package detection of the separation-sensing sensor 406b and the track end sensor 406a—that is, the separation-sensing sensor 406b detecting the presence and absence of an electronic package, followed by the track end sensor 406a detecting the presence of an electronic package whilst the separation-sensor sensor 406b still detecting the absence of an electronic package— means that the leading and adjacent electronic packages 605a, 605b have been successfully separated. Otherwise, it would suggest an occurrence of piggybacking and an auto-separation recovery is then required. In the case of a successful separation, a suction force is created by the suction device 306 to remove the leading electronic package 605a from the conveying track 402 at the position of the first vacuum passage 404b.

Figure 6:
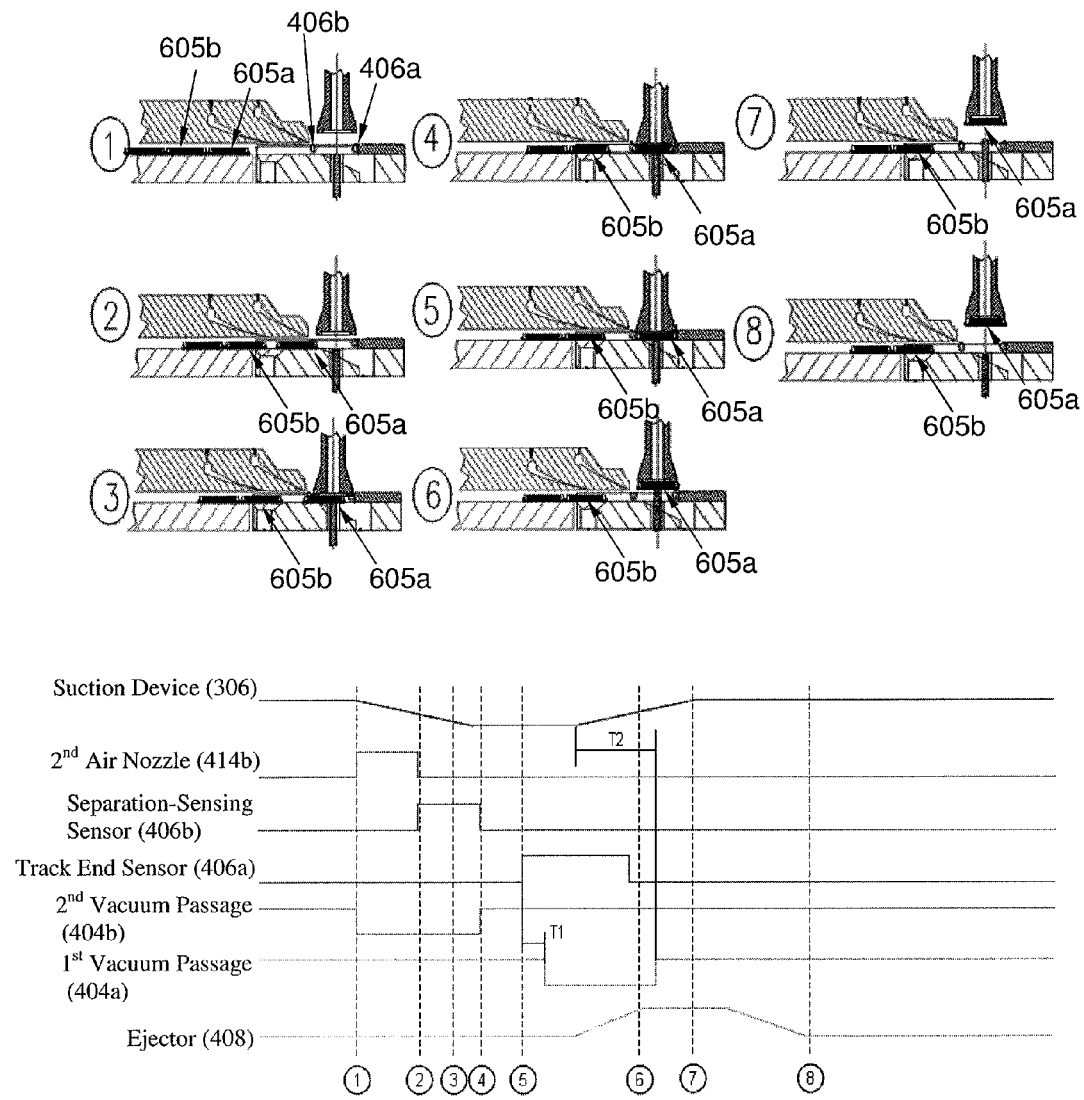
FIG. 6 shows an operation of the test handler of FIG. 3 and includes timing charts that show the inter-operational relationship among components of the test handler.

Between the fifth and sixth operational steps of the test handler 300, it can be seen from the timing charts in FIG. 6 that T1 seconds following the track end sensor 406a detecting the leading electronic package 605a at the first device position, the first vacuum passage 404a is deactivated. For example, T1 may be between 3-5 ms. Deactivation of the first vacuum passage 404a allows the leading electronic package 605a to be effectively picked up by the suction device 306. Nevertheless, it should be appreciated that the deactivation of the first vacuum passage 404a is merely a preferred option.

It can also be seen that suction device 306 begins its ascent away from the conveying track 402 of the transfer apparatus 310 between the fifth and sixth operational steps of the test handler 300. As the suction device 306 moves upward, the ejecting pin 408 moves upward in tandem to lift the leading electronic package 605a away from the conveying track 402 until the ejecting pin 408 reaches its maximum height during the sixth operational step of the test handler 300. Such a height may be any suitable height for overcoming residual vacuum force—or, indeed, the actual vacuum force—of the first vacuum passage 404a, so that the leading electronic package 605a is effectively transferred by the suction device 306 from the transfer apparatus 304 to the testing apparatus 302. When that happens, the track end sensor 406a detects an absence of the leading electronic package 605a at the first device position of the conveying track 402.

Between the sixth and seventh operational steps of the test handler 300, it can be seen that the first vacuum passage 404a is re-activated T2 seconds following the start of the ascent of the suction device 306. This is done to ensure that the vacuum force of the first vacuum passage 404a does not undesirably impede the transfer of the leading electronic package 605a to the turret 302. For instance, T2 may be between 10-15 ms.

And finally, it can be seen that the ejecting pin 408 retracts between the seventh and eight operational steps of the test handler 300 to prepare for lifting the next leading electronic package 605b in a next operational cycle of the test handler operation.

Various embodiments of the invention can also be envisaged without departing from the scope of the claimed invention. For instance, although the transfer apparatus 304 is described as a feature of the test handler 300, the transfer apparatus 304 may also be used in relation to other devices, such as surface-mounting devices for mounting electronic packages to printed circuit boards.

The invention claimed is:

1. A transfer apparatus for transferring electronic devices, the transfer apparatus comprising:
a conveying track for conveying electronic devices in a row having a leading electronic device located at a front of the row;
first and second vacuum passages connected to the conveying track, the first and second vacuum passages being operative to create vacuum forces to hold electronic devices against the conveying track at a first device position and a second device position respectively such that there is no overlapping between the electronic devices; and
first and second sensors arranged with respect to the conveying track, the first sensor being operative to detect a presence or absence of the leading electronic device at the first device position for removal of the leading electronic device from the conveying track, and the second sensor being operative to detect a presence or absence of the leading electronic device at a sensor position between the first and second device positions as the leading electronic device is conveyed along the conveying track from the second vacuum passage to the first vacuum passage; and
first and second air nozzles for directing air toward the electronic devices to push the electronic devices toward the first vacuum passage, the first and second air nozzles being arranged with respect to the first and second sensors, respectively,
wherein the second air nozzle is deactivated while the first air nozzle remains activated upon the second sensor detecting the leading electronic device at the sensor position between the first and second device positions, so as to ensure separation between the leading electronic device and the next leading electronic device along the conveying track.

2. The transfer apparatus of claim 1, wherein the second vacuum passage is operative to create a vacuum force to hold an electronic device adjacent to the leading electronic device against the conveying track at the second device position based on the detection of the leading electronic device by the second sensor at the sensor position, in order to maintain a separation between the leading electronic device from the adjacent electronic device.

3. The transfer apparatus of claim 1, further comprising an ejector arranged within an ejector passage, the ejector being operative to extend from the ejector passage to push the leading electronic device away from the first vacuum passage to assist in the removal of the leading electronic device from the conveying track at the first device position.

4. The transfer apparatus of claim 3, wherein the ejector is a pin.

5. The transfer apparatus of claim 3, wherein the ejector is configured to push the leading electronic device through a distance of about 1.5 mm away from the first vacuum passage.

6. A test handler comprising:
a testing apparatus for testing operational characteristics of electronic devices;
the transfer apparatus of claim 1 for conveying the electronic devices; and
a suction device for transferring the electronic devices from the transfer apparatus to the testing apparatus.

7. A method of transferring electronic devices using a transfer apparatus of claim 1, the method comprising the steps of:
conveying the electronic devices along the conveying track from the second vacuum passage to the first vacuum passage;
detecting the leading electronic device at the sensor position using the second sensor;
activating the second vacuum passage to create a vacuum force to hold an electronic device adjacent to the leading electronic device against the conveying track at the second device position based on the detection of the leading electronic device by the second sensor at the sensor position, in order to maintain a separation between the leading electronic device and the adjacent electronic device;
detecting the leading electronic device at the first device position using the first sensor; and removing the leading electronic device from the conveying track.

8. The method of claim 7, wherein the step of activating the second vacuum passage comprises the second sensor detecting an absence of the leading electronic device following the second sensor detecting a presence of the leading electronic device.

9. The method of claim 7, wherein the step of removing the leading electronic device from the conveying track comprises deactivating the first vacuum passage following a predetermined time period after the first sensor detects the presence of the leading electronic device.

10. The method of claim 9, wherein the predetermined time period is between 35 ms.

11. The method of claim 7, further comprising the step of directing air towards the leading electronic device using an air nozzle to push the leading electronic device towards the first vacuum passage.

12. The method of claim 11, further comprising the step of deactivating the second vacuum passage upon the air nozzle being activated to direct air towards the leading electronic device.

13. The method of claim 12, further comprising the step of deactivating the air nozzle upon the second sensor detecting the presence of the leading electronic device, to prevent the adjacent electronic device from contacting the leading electronic device.

* * * * *